(12) United States Patent
Cho (10) Patent No.: US 9,722,604 B2
(45) Date of Patent: Aug. 1, 2017

(54) CURRENT-MODE LOGIC CIRCUIT HAVING A WIDE OPERATING RANGE

(71) Applicant: Xilinx, Inc., San Jose, CA (US)

(72) Inventor: Junho Cho, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/634,646

(22) Filed: Feb. 27, 2015

(65) Prior Publication Data

US 2016/0254813 A1   Sep. 1, 2016

(51) Int. Cl.
*H03K 19/00*   (2006.01)
*H03K 19/0944*   (2006.01)
*H03K 19/0175*   (2006.01)

(52) U.S. Cl.
CPC . *H03K 19/0013* (2013.01); *H03K 19/017545* (2013.01); *H03K 19/09441* (2013.01)

(58) Field of Classification Search
CPC ......... H03K 3/0322; H03K 19/018521; H03K 3/012; H03K 3/356113; H03K 3/35625; H03K 5/003; H03K 23/542; H03K 19/0963; H03K 19/0136; H03K 19/01721; H03K 3/289; H03K 3/356017; H03K 5/02; G11C 7/062; G11C 2207/063; G11C 7/065; G11C 7/00; G11C 11/4091; G11C 16/3431; G11C 7/10; G11C 7/1078; H03F 2203/45138; H03F 3/45475; H03F 2200/91
USPC .................... 326/82–89, 115, 121, 126, 127; 327/51–57; 365/154
See application file for complete search history.

(56) References Cited

U.S. PATENT DOCUMENTS

| | | | | |
|---|---|---|---|---|
| 7,236,011 B2 * | 6/2007 | Tam | .................. | H03K 19/09432 326/83 |
| 2007/0018694 A1 * | 1/2007 | Chen | ................ | H03K 19/09432 326/115 |
| 2007/0200605 A1 * | 8/2007 | Marsh | .............. | H03K 3/356043 327/208 |
| 2013/0127507 A1 * | 5/2013 | Zhuang | .............. | H03K 3/35625 327/203 |
| 2014/0269027 A1 * | 9/2014 | Tayal | .................... | G11C 11/412 365/156 |
| 2015/0319020 A1 * | 11/2015 | Song | ................. | H04L 25/03949 345/204 |

OTHER PUBLICATIONS

Tao Wang and Fei Yuan, "A New Current-Mode Incremental Signaling Scheme With Applications to Gb/s Parallel Links", IEEE Tr. On Circuit and Systems—I, vol. 54, No. 2, Feb 2007, pp. 255-267.*

(Continued)

*Primary Examiner* — Alexander H Taningco
*Assistant Examiner* — Seokjin Kim
(74) *Attorney, Agent, or Firm* — Robert M. Brush (57) ABSTRACT

In one example, a current-mode logic (CML) circuit includes a differential transistor pair having a differential input port configured to receive a differential input voltage, a bias port configured for coupling to a current source, and a differential output port. The CML circuit further includes a load circuit coupled to the differential output port. The load circuit includes an active inductive load, a cross-coupled transistor pair, and a switch coupled between the cross-coupled transistor pair and the differential output.

18 Claims, 6 Drawing Sheets

(56) References Cited

OTHER PUBLICATIONS

Bui and Savaria, "Shunt-Peaking of MCML Gates Using Active Inductors", The 2nd Annual IEEE Northeast Workshop on Circuit and Systems, 2004 (NEWCAS 2004), pp. 361-364.*

Wu, Chia-Hsin et al., "A 1V 4.2mW Fully Integrated 2.5Gb/s CMOS Limiting Amplifier using Folded Active Inductors", Proceedings of the 2004 IEEE International Symposium on Circuits and Systems, 2004 ISCAS'04, vol. 1, May 23-26, 2004, I-1044-7 pp., Vancouver, British Columbia, Canada.

* cited by examiner

CURRENT-MODE LOGIC CIRCUIT HAVING A WIDE OPERATING RANGE

TECHNICAL FIELD

Examples of the present disclosure generally relate to electronic circuits and, in particular, to a current-mode logic (CML) circuit having a wide operating range.

BACKGROUND

Conventional complementary metal oxide semiconductor (CMOS) logic is the technology standard for high-density digital logic. CMOS logic, however, has speed limitations that prevent its usage in many high-speed applications. Current-mode logic (CML) is a differential digital logic family that can operate at higher speeds than conventional CMOS logic. While improving upon conventional CMOS logic, CML logic is still limited in terms of operating frequency due to parasitic capacitance at the output of CML logic cells. Inductive peaking (also referred to as inducting broadbanding) is a technique that can be employed to improve operating speed of CML logic. In inductive peaking, an inductor loads the output of a CML circuit. The load inductor mitigates the parasitic capacitance and allows for operation at data rates significantly higher than conventional CML logic. However, use of an inductor to load a CML circuit results in a narrow operating range. Operating a CML circuit with a load inductor outside of its narrow operating range significantly reduces the gain of the CML circuit and results in additional power consumption.

SUMMARY

Techniques for providing a current-mode logic (CML) circuit having a wide operating range are described. In an example, a current-mode logic (CML) circuit includes a differential transistor pair having a differential input port configured to receive a differential input voltage, a bias port configured for coupling to a current source, and a differential output port. The CML circuit further includes a load circuit coupled to the differential output port. The load circuit includes an active inductive load, a cross-coupled transistor pair, and a switch coupled between the cross-coupled transistor pair and the differential output.

In another example, a CML circuit includes a plurality of CML cells coupled to perform a logic operation. Each of the CML cells comprises a differential transistor pair having a differential input port configured to receive a differential input voltage, a bias port configured for coupling to a current source, and a differential output port; and a load circuit coupled to the differential output port, the load circuit comprising: an active inductive load; a cross-coupled transistor pair; and a switch coupled between the cross-coupled transistor pair and the differential output.

In another example, a method of operating a CML circuit having a differential transistor pair coupled to a load circuit configured for inductive broadbanding includes: coupling a differential input signal to a differential input port of a differential transistor pair; controlling a switch to couple a cross-coupled transistor pair of the load circuit to a differential output port of the differential transistor pair; and receiving a differential output signal from the differential output port of the differential transistor pair.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for providing a current-mode logic (CML) circuit having a wide operating range are described. A "CML circuit" as used herein encompasses circuits that switch a current between output loads using at least one differential transistor pair. A differential transistor pair includes a differential input and a differential output and hence CML circuits operate using differential signals. Various types of circuits can be implemented using CML logic, such as buffers, logic gates, multiplexers, dividers, latches, flip-flops, or the like.

In an example, a CML circuit includes a load circuit that employs cross-coupled active inductive peaking logic ("cross-coupled active inductive load"). The cross-coupled active inductive load comprises an active inductive load, a cross-coupled transistor pair, and a switch coupled between the cross-coupled transistor pair and a differential output of the CML circuit. The switch can be controlled to selectively couple the cross-coupled transistor pair to the differential output of the CML circuit. When coupled to the differential output of the CML circuit, the cross-coupled transistor pair applies positive feedback to increase gain. For example, the cross-coupled transistor pair can be used to increase gain when the operating frequency is less than the frequency at which inductive peaking occurs, allowing for a wider operating range than possible when conventional inductive peaking is used. The cross-coupled transistor pair also provides power reduction as compared to conventional inductive peaking. Further, the switch can be configured to shield the differential output against parasitic capacitance of the cross-coupled transistor pair. The cross-coupled active inductive load described herein can be used with various CML circuits, such as buffers, logic gates, multiplexers, dividers, latches, flip-flops, and the like.

Figure 1A:
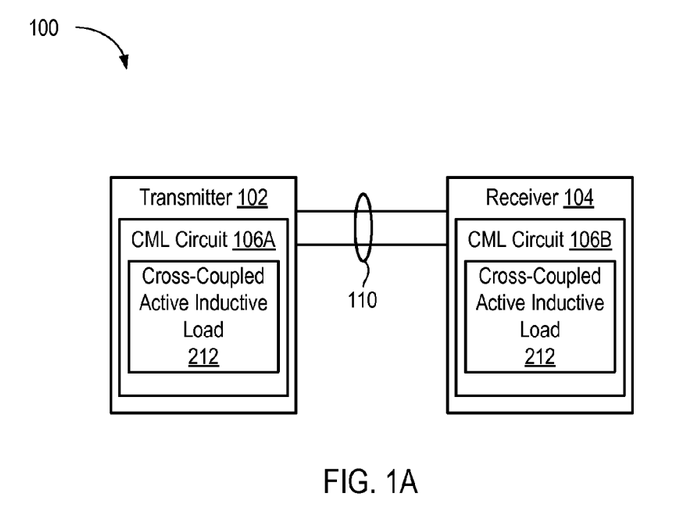
FIG. 1A is a block diagram depicting an example of a communication system in which cross-coupled active inductive loads can be employed.

FIG. 1A is a block diagram depicting an example of a communication system 100 in which cross-coupled active inductive loads can be employed. The communication system 100 includes a transmitter 102 coupled to a receiver 104 by a transmission channel 110. The transmission channel 110 comprises a differential pair of conductors and can be implemented on, for example, a printed circuit board (PCB), integrated circuit (IC), or the like. The transmitter 102 couples a differential signal to the transmission channel 110. The receiver 104 receives the differential signal from the transmission channel 110. The differential signal on the transmission channel 110 includes two signals of equal magnitude and opposite polarity. That is, the transmission channel 110 includes one trace that carries a "positive signal", and another trace that carries a "negative signal" of equal magnitude and opposite polarity from the positive signal. Information is conveyed using the difference between the positive and negative signals. The transmitter 102 includes a CML circuit 106A configured to generate a differential signal for coupling to the transmission channel 110. The receiver 104 includes a CML circuit 106B configured to receive a differential signal from the transmission channel 110. Each of the CML circuits 106A and 106B include cross-coupled active inductive load 212, which is described in more detail below.

Figure 1B:
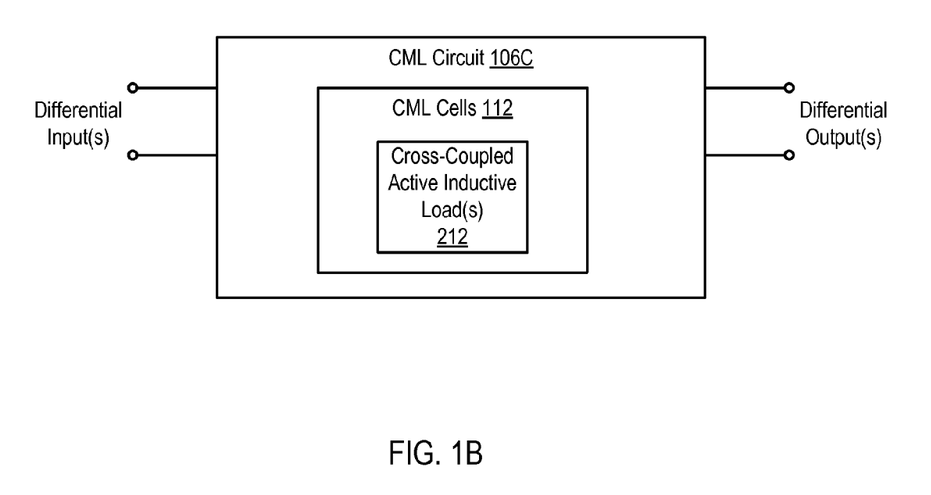
FIG. 1B is a block diagram depicting an example of a CML circuit in which cross-coupled active inductive loads can be employed.

FIG. 1B is a block diagram depicting an example of a CML circuit 106C in which cross-coupled active inductive loads can be employed. The CML circuit 106C comprises one or more differential inputs, one or more differential outputs, and a plurality of CML cells 112. The CML cells 112 can be combined to form various types of circuits, such as buffers, logic gates, multiplexers, dividers, latches, flip-flops, and the like. The CML cells 112 include one or more cross-coupled active inductive loads 212. For example, a cross-coupled active inductive load can be coupled to each of the differential output(s) driven by the CML cells 112 of the CML circuit 106C.

Figure 1C:
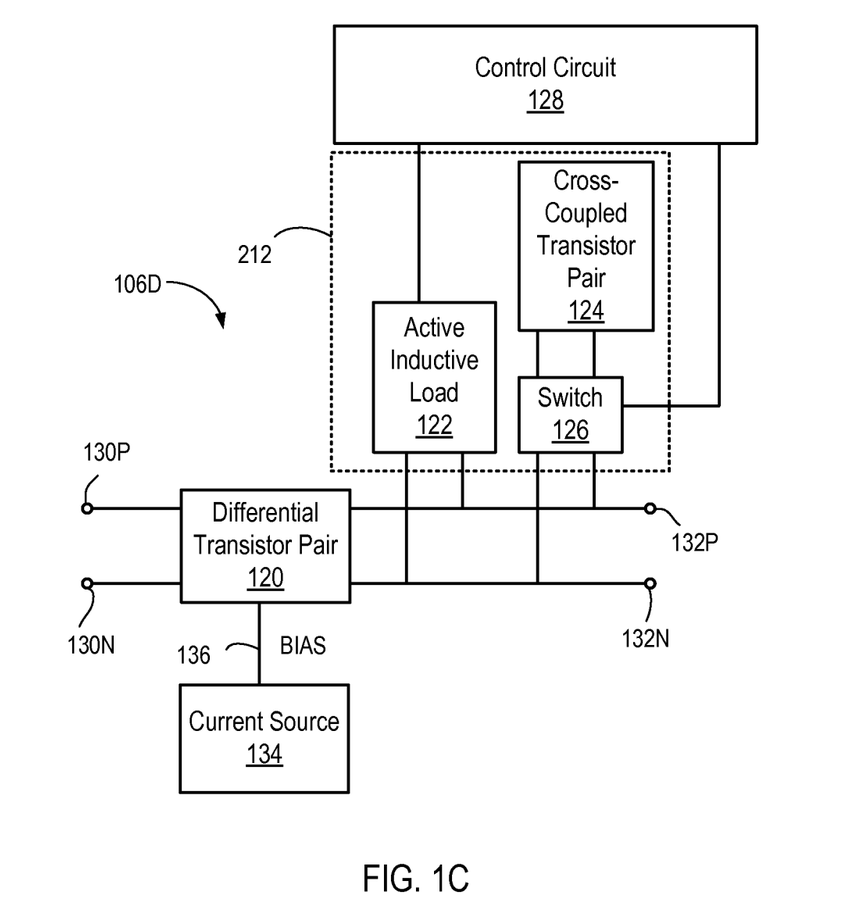
FIG. 1C is a block diagram depicting an example of a CML circuit in which a cross-coupled active inductive load can be employed.

FIG. 1C is a block diagram depicting an example of a CML circuit 106D in which a cross-coupled active inductive load can be employed. The CML circuit 106D comprises a differential transistor pair 120 having a differential input and a differential output. The differential input comprises a positive input 130P and a negative input 130N, and the differential output comprises a positive output 132P and a negative output 132N. The CML circuit 106D further includes a cross-coupled active inductive load 212, which comprises an active inductive load 122, a cross-coupled transistor pair 124, and a switch 126. The active inductive load 122 is coupled to the differential output. The cross-coupled transistor pair 124 is coupled to the differential output through the switch 126. A control circuit 128 can be coupled to the active inductive load 122 and the switch 126. For example, the active inductive load 122 can provide adjustable inductance, which can be controlled by the control circuit 128. The control circuit 128 can control the state of the switch 126 such that the cross-coupled transistor pair 124 can be selectively coupled to the differential output. A bias port 136 of the differential transistor pair 120 is coupled to a current source 134. The current source 134 supplies or sinks current for biasing the differential transistor pair 120.

In operation, the active inductive load 122 compensates for parasitic capacitance of the differential transistor pair 120 at the differential output. When coupled to the differential output, the cross-coupled transistor pair 124 provides positive feedback to increase gain of the CML circuit 106D for a particular operating range. An example operating range is described below with respect to FIG. 4. In the example, described more fully below, the gain of a CML circuit can be increased for both high-frequency operation (e.g., proximate the inductive peaking frequency) and low-frequency operation (e.g., frequencies less than the inductive peaking frequency). The cross-coupled transistor pair 124 also effectively increases voltage swing of the differential output in both high-frequency and low-frequency operation without an increase in power dissipation. The switch 126 can be configured to shield the differential output from parasitic capacitance of the cross-coupled transistor pair 124.

Figure 2A:
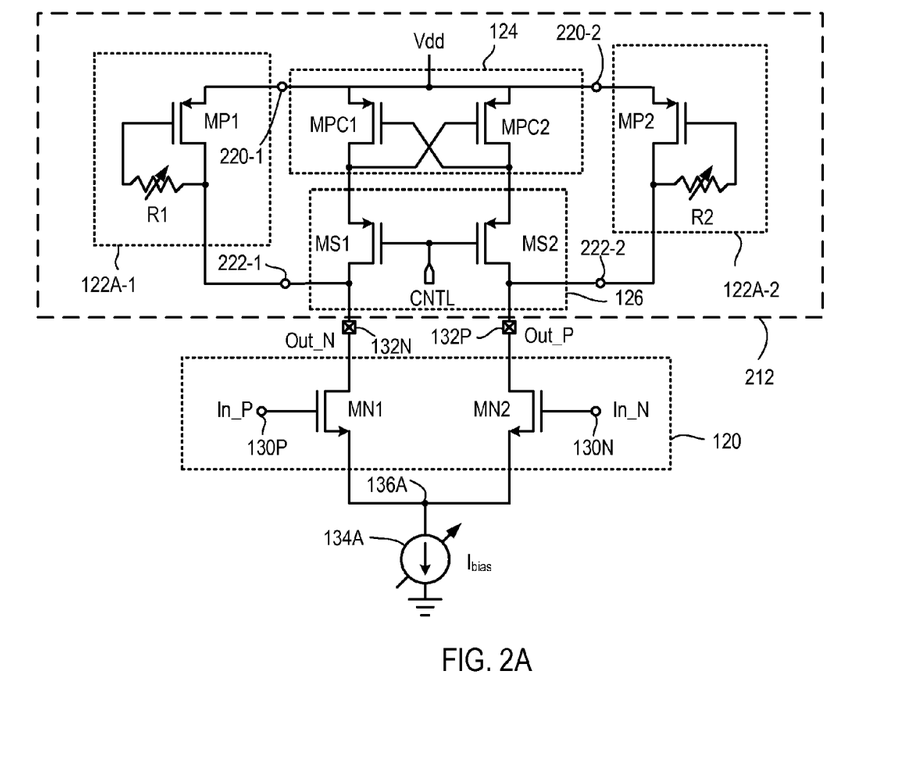
FIG. 2A is a schematic diagram depicting an example CML circuit.

FIG. 2A is a schematic diagram depicting an example CML circuit 106. The CML circuit 106 can be in any of the CML circuits 106A-106D in the examples described above with respect to FIG. 1. The CML circuit 106 comprises the differential transistor pair 120 and the cross-coupled active inductive load 212 (also referred to as a load circuit 212). The load circuit 212 comprises an active inductor 122A-1 and an active inductor 122A-2. The active inductors 122A-1 and 122A-2 collectively comprise the active inductive load 122. The load circuit 212 further comprises the cross-coupled transistor pair 124 and the switch 126.

The differential transistor pair 120 comprises transistors MN1 and MN2. In the example shown, the transistors MN1 and MN2 comprise n-channel field effect transistors (FETs), such as n-type metal oxide semiconductor field effect transistors (MOSFETs) or the like known in the art. Gates of the transistors MN1 and MN2 are configured to receive positive input 130P and negative input 130N of a differential input port. Sources of the transistors MN1 and MN2 are coupled to a bias port 136A. The bias port 136A is coupled to a current source 134A that sinks a current $I_{bias}$ from the bias port 136A. Drains of the transistors MN1 and MN2 are coupled to a negative output 132N and a positive output 132P, respectively.

The switch 126 comprises a transistor MS1 and a transistor MS2. In the example shown, the transistors MS1 and MS2 comprise p-channel FETs, such as p-type MOSFETs or the like known in the art. Gates of the transistors MS1 and MS2 are coupled to receive a control signal CNTL (e.g., generated by a control circuit 128). Drains of the transistors MS1 and MS2 are coupled to the negative output 132N and the positive output 132P, respectively.

The cross-coupled transistor pair 124 comprises a transistor MPC1 and a transistor MPC2. In the example shown, the transistors MPC1 and MPC2 comprise p-channel FETs, such as p-type MOSFETS or the like known in the art. Drains of the transistors MPC1 and MPC2 are coupled to sources of the transistors MS1 and MS2, respectively. Sources of the transistors MPC1 and MPC2 are coupled to a supply voltage Vdd. A gate of the transistor MPC1 is coupled to the drain of the transistor MPC2, and a gate of the transistor MPC2 is coupled to the drain of the transistor MPC1.

The active inductors 122A-1 and 122A-2 each comprise a two-terminal device that effectively acts as an inductor. The active inductor 122A-1 includes ports 220-1 and 222-1. The active inductor 122A-2 includes ports 220-2 and 222-2. In the example shown, the active inductor 122A-1 comprises a transistor MP1 and a resistance R1 and the active inductor 122A-2 comprises a transistor MP2 and a resistance R2. The transistors MP1 and MP2 comprise p-channel FETs, such as p-type MOSFETs or the like known in the art. Sources of the transistors MP1 and MP2 are coupled to the ports 220-1 and 220-2, which are in turn coupled to the supply voltage Vdd. Drains of the transistors MP1 and MP2 are coupled to the ports 222-1 and 222-2, which are in turn coupled to the negative output 132N and the positive output 132P, respectively. The resistance R1 is coupled between the gate and the drain of the transistor MP1. The resistance R2 is coupled between the gate and the drain of the transistor MP2. The resistance R1 and the resistance R2 can each comprise a programmable resistor that can provide a plurality of resistance values. The resistances R1 and R2 can be controlled, for example, by a control circuit (e.g., the control circuit 128). Alternatively, each of the resistance R1 and R2 can comprise a resistor having a fixed value.

Each of the active inductor 122A-1 and 122A-2 has an impedance looking into the port 222-1 and 222-2, respectively (e.g., drain impedance in the present example or $Z_{drain}$). Consider an active inductive load identical to the active inductor 122A-1 and 122A-2 comprising a p-channel transistor MP and a resistor R. At low frequencies, the parasitic capacitance between the gate and drain of the transistor MP ($C_{gd}$) is effectively open and $Z_{drain}$ is approximately equal to $1/g_m$, where $g_m$ is the transconductance of the transistor MP (sometimes referred to as transadmittance). At high frequencies, the parasitic capacitance $C_{gd}$ is effectively a short and $Z_{drain}$ is approximately equal to the value of the resistance R. Specifically, at an angular frequency of $1/(C_{gd}*R)$ the impedance $Z_{drain}$ is approximately $1/g_m$, and at an angular frequency of $g_m/C_{gd}$ the impedance $Z_{drain}$ is approximately R (assuming $g_m*R>1$). Between the angular frequencies $1/(C_{gd}*R)$ and $g_m/C_{gd}$, the impedance $Z_{drain}$ increases linearly (approximately linear) with an approximate slope of $(C_{gd}*R)/g_m$.

In operation, the CML circuit 106 operates as a buffer. That is, the differential output follows the differential input. The CML circuit 106 operates by switching the current $I_{bias}$ with the differential transistor pair 120 between the active inductor 122A-1 and the active inductor 122A-2. When the input voltage difference between In_P and In_N is a positive potential, more current is steered towards the active inductor 122A-1 than towards the active inductor 122A-2. This effectively drops the voltage on the negative output 132N and raises the voltage on the positive output 132P, which results in a positive potential on the differential output. Similarly, when the input voltage difference between In_P and In_N is a negative potential, more current is steered towards the active inductor 122A-2 than towards the active inductor 122A-1. This effectively drops the voltage on the positive output 132P and raises the voltage on the negative output 132N, which results in a negative potential on the differential output.

When CNTL is at Vdd, the transistors MS1 and MS2 are cut-off and the cross-coupled transistor pair 124 is not coupled to the differential output. When CNTL is at a reference voltage (e.g., electrical ground), the transistors MS1 and MS2 saturate and turn on, which couples the cross-coupled transistor pair 124 to the differential output. When the switch 126 is on, the cross-coupled transistor pair 124 provides positive feedback to increase potential difference on the differential output for a given operating range. Specifically, when the input voltage difference between In_P and In_N is a positive potential, the transistor MPC2 eventually turns on and drives the positive output 132P towards Vdd. Likewise, when the input voltage difference between In_P and In_N is a negative potential, the transistor MPC1 eventually turns on and drives the negative output 132N towards Vdd. When the switch 126 is off, the cross-coupled transistor pair 124 does not affect the differential output.

Figure 4:
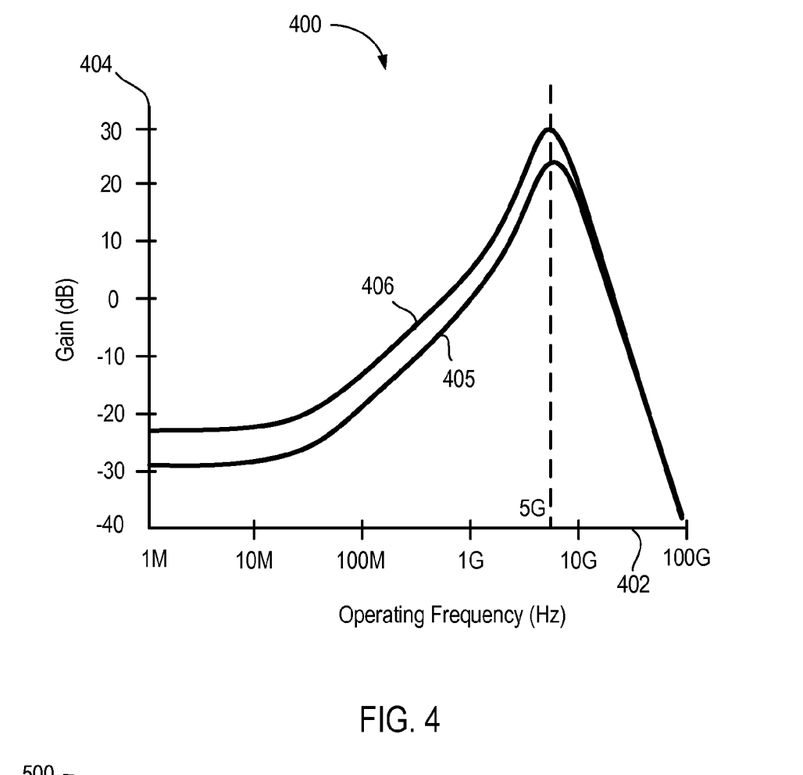
FIG. 4 shows an example graph of the gain of the CML circuit shown in FIG. 2 both with and without a cross-coupled transistor pair in the load circuit.

FIG. 4 shows an example graph 400 of the gain of the CML circuit 106 when the switch 126 is both on and off. The graph 400 includes an axis 402 (x-axis) representing frequency on a log scale, and an axis 404 (y-axis) representing gain in decibels (dB). A curve 405 shows the gain of the CML circuit 106 without the cross-coupled transistor pair 124 (e.g., the switch 126 is off). A curve 406 shows the gain with the cross-coupled transistor pair 124 (e.g., the switch 126 is on). In the present example, the inductive peaking frequency is approximately 5 GHz. For frequencies higher than the inductive peaking frequency, the gain falls off similarly for both curves 405 and 406. For frequencies around the inductive peaking frequency and for frequencies below the inductive peaking frequency, the gain with the cross-coupled transistor pair 124 is higher than without. For example, the graph 400 shows approximately a 10 dB improvement in gain. The values shown in the graph 400 are merely example values and other curves can result depending on the transistors and resistances used in the CML circuit 106.

Returning to FIG. 2A, in an example, the transistors MS1 and MS2 can have a smaller width than the transistors MPC1 and MPC2. The smaller width of the transistors MS1 and MS2 mitigates parasitic capacitance on the differential output caused by the transistors MPC1 and MPC2. The larger width of the transistors MPC1 and MPC2 can allow for increased positive feedback and increased gain. The transistors MPC1 and MPC2 can be made larger, since the transistors MS1 and MS2 shield the differential output from the increased parasitic capacitance.

In the example shown, the CML circuit 106 comprises a buffer. Those skilled in the art will appreciate that a cross-coupled transistor pair can be added to load circuits of other types of CML circuits in order to achieve the same or similar advantages discussed above. For example, a cross-coupled transistor pair can be added to load circuits of logic gates, multiplexers, dividers, latches, flip-flops, and the like that include CML logic.

Figure 3:
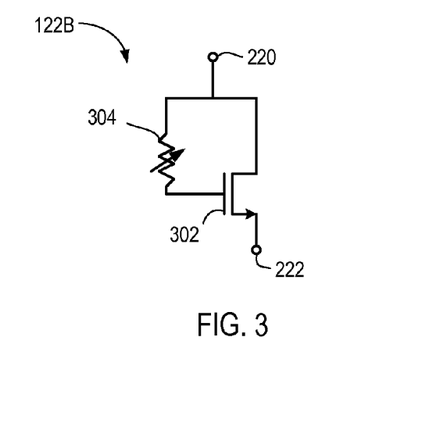
FIG. 3 is a schematic diagram shown another example of an active inductor.

FIG. 3 is a schematic diagram shown another example of an active inductor 122B that can be used in a CML circuit along with a cross-coupled transistor pair. The active inductor 122B comprises an n-channel transistor 302 having a drain coupled to a port 220 and a source coupled to a port 222. A resistor 304 is coupled between a gate of the transistor 302 and the drain of the transistor 302. The resistor 304 can be a programmable resistor or a fixed resistor. The active inductor 122B can be used in place of each of the active inductor 122A-1 and 122A-2, where the port 220 replaces the port 220-1 or 220-2 and the port 222 replaces the port 222-1 or 222-2.

Figure 2B:
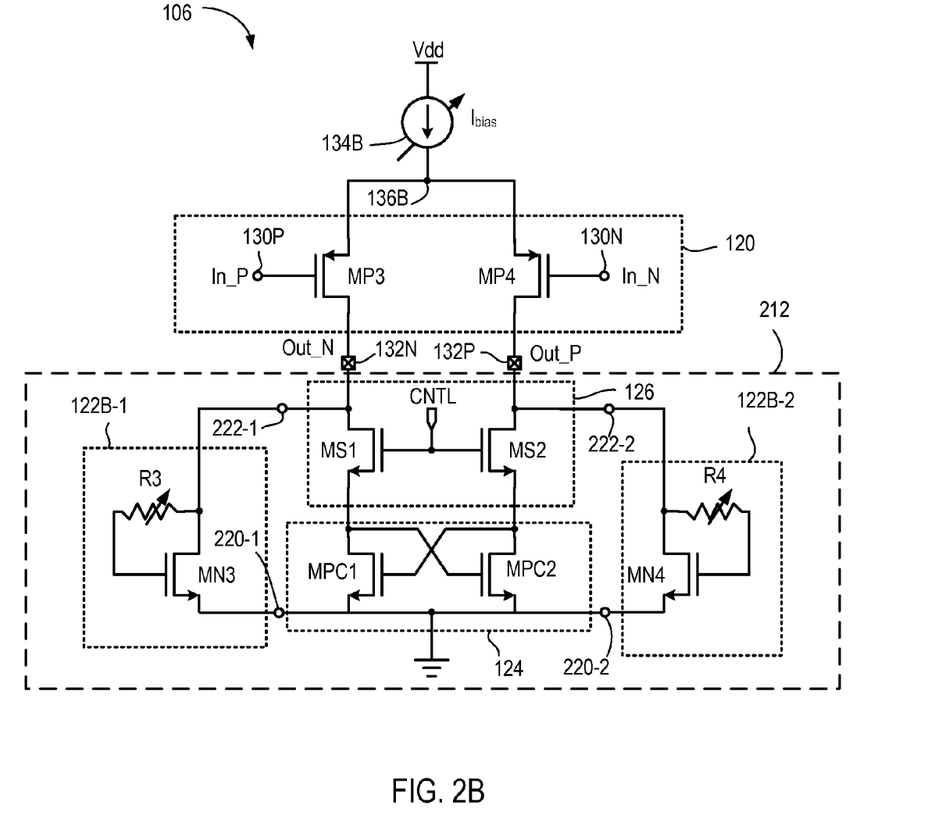
FIG. 2B is a schematic diagram depicting another example CML circuit.

FIG. 2B is a schematic diagram depicting another example of the CML circuit 106. In the present example, the differential transistor pair 120 comprises p-channel transistors, as opposed to n-channel transistors shown in the example of FIG. 2A. In the present example, the differential transistor pair 120 comprises transistors MP3 and MP4. In the example shown, the transistors MP3 and MP4 comprise p-channel FETs, such as p-type MOSFETs or the like known in the art. Gates of the transistors MP3 and MP4 are configured to receive the positive input 130P and the negative input 130N of the differential input port. Sources of the transistors MP3 and MP4 are coupled to the bias port 136B. The bias port 136B is coupled to a current source 134B that supplies a current $I_{bias}$ to the bias port 136B. Drains of the transistors MP3 and MP4 are coupled to the negative output 132N and the positive output 132P, respectively.

The switch 126 comprises a transistor MS1 and a transistor MS2. In the example shown, the transistors MS1 and MS2 comprise n-channel FETs, such as n-type MOSFETs or the like known in the art. Gates of the transistors MS1 and MS2 are coupled to receive a control signal CNTL (e.g., generated by a control circuit 128). Drains of the transistors MS1 and MS2 are coupled to the negative output 132N and the positive output 132P, respectively.

The cross-coupled transistor pair 124 comprises a transistor MPC1 and a transistor MPC2. In the example shown, the transistors MPC1 and MPC2 comprise n-channel FETs, such as n-type MOSFETS or the like known in the art. Drains of the transistors MPC1 and MPC2 are coupled to sources of the transistors MS1 and MS2, respectively. Sources of the transistors MPC1 and MPC2 are coupled to a reference voltage (e.g., electrical ground). A gate of the transistor MPC1 is coupled to the drain of the transistor MPC2, and a gate of the transistor MPC2 is coupled to the drain of the transistor MPC1.

The active inductors 122B-1 and 122B-2 each comprise a two-terminal device that effectively acts as an inductor. The active inductors 122B-1 and 122B-2 are configured as shown in FIG. 3. The active inductor 122B-1 includes ports 220-1 and 222-1. The active inductor 122B-2 includes ports 220-2 and 222-2. In the example shown, the active inductor 122B-1 comprises a transistor MN3 and a resistance R3 and the active inductor 122B-2 comprises a transistor MN4 and a resistance R4. The transistors MN3 and MN4 comprise n-channel FETs, such as n-type MOSFETs or the like known in the art. Sources of the transistors MN3 and MN4 are coupled to the ports 220-1 and 220-2, which are in turn coupled to the reference voltage. Drains of the transistors MN3 and MN4 are coupled to the ports 222-1 and 222-2, which are in turn coupled to the negative output 132N and the positive output 132P, respectively. The resistance R3 is coupled between the gate and the drain of the transistor MN3. The resistance R4 is coupled between the gate and the drain of the transistor MN4. The resistance R3 and the resistance R4 can each comprise a programmable resistor that can provide a plurality of resistance values. The resistances R3 and R4 can be controlled, for example, by a control circuit (e.g., the control circuit 128). Alternatively, each of the resistance R3 and R4 can comprise a resistor having a fixed value.

Each of the active inductor 122B-1 and 122B-2 has an impedance looking into the port 222-1 and 222-2, respectively (e.g., source impedance in the present example or $Z_{source}$). Consider an active inductive load identical to the active inductor 122B-1 and 122B-2 comprising an n-channel transistor MN and a resistor R. At low frequencies, the parasitic capacitance between the gate and source of the transistor MN ($C_{gs}$) is effectively open and $Z_{source}$ is approximately equal to $1/g_m$, where $g_m$ is the transconductance of the transistor MN (sometimes referred to as transadmittance). At high frequencies, the parasitic capacitance $C_{gs}$ is effectively a short and $Z_{source}$ is approximately equal to the value of the resistance R. Specifically, at an angular frequency of $1/(C_{gs}*R)$ the impedance $Z_{source}$ is approximately $1/g_m$, and at an angular frequency of $g_m/C_{gs}$ the impedance $Z_{source}$ is approximately R (assuming $g_m*R>1$). Between the angular frequencies $1/(C_{gs}*R)$ and $g_m/C_{gs}$, the impedance $Z_{source}$ increases linearly (approximately linear) with an approximate slope of $(C_{gs}*R)/g_m$.

In operation, the CML circuit 106 shown in FIG. 2B operates as a buffer. That is, the differential output follows the differential input. The CML circuit 106 operates by switching the current $I_{bias}$ with the differential transistor pair 120 between the active inductor 122B-1 and the active inductor 122B-2. When the input voltage difference between In_P and In_N is a positive potential, more current is steered towards the active inductor 122B-2 than towards the active inductor 122B-1. This effectively drops the voltage on the negative output 132N and raises the voltage on the positive output 132P, which results in a positive potential on the differential output. Similarly, when the input voltage difference between In_P and In_N is a negative potential, more current is steered towards the active inductor 122B-1 than towards the active inductor 122B-2. This effectively drops the voltage on the positive output 132P and raises the voltage on the negative output 132N, which results in a negative potential on the differential output.

When CNTL is at the reference voltage, the transistors MS1 and MS2 are cut-off and the cross-coupled transistor pair 124 is not coupled to the differential output. When CNTL is at a sufficient positive voltage (e.g., Vdd), the transistors MS1 and MS2 saturate and turn on, which couples the cross-coupled transistor pair 124 to the differential output. When the switch 126 is on, the cross-coupled transistor pair 124 provides positive feedback to increase potential difference on the differential output for a given operating range. Specifically, when the input voltage difference between In_P and In_N is a positive potential, the transistor MPC1 eventually turns on and drives the negative output 132N towards the reference voltage. Likewise, when the input voltage difference between In_P and In_N is a negative potential, the transistor MPC2 eventually turns on and drives the positive output 132P towards the reference voltage. When the switch 126 is off, the cross-coupled transistor pair 124 does not affect the differential output.

Figure 5:
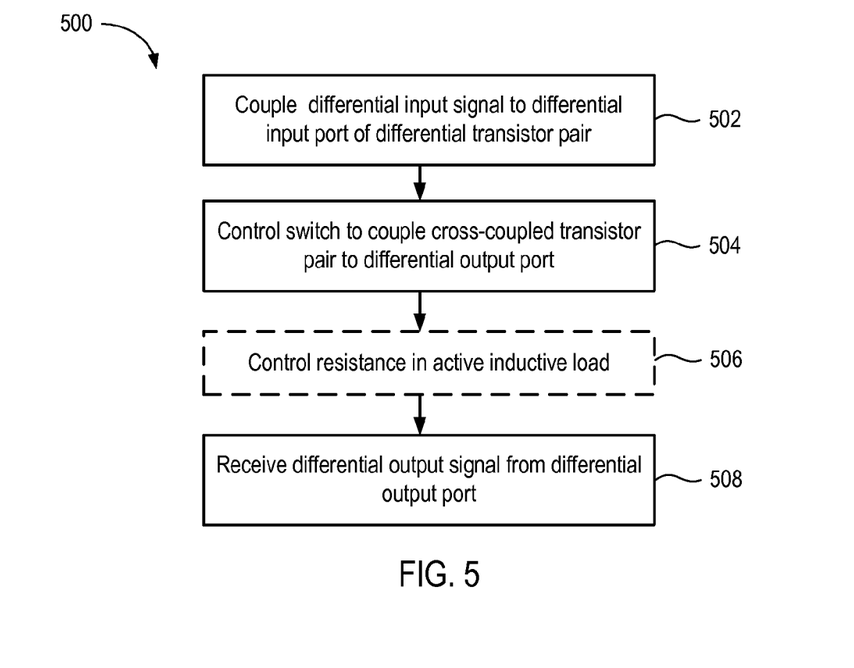
FIG. 5 is a flow diagram depicting a method of operating a CML circuit having a differential transistor pair coupled to a load circuit configured for inductive peaking.

FIG. 5 is a flow diagram depicting a method 500 of operating a CML circuit having a differential transistor pair coupled to a load circuit configured for inductive peaking. At step 502, a differential input signal is coupled to a differential input port of the differential transistor pair. At step 504, a switch is controlled to couple a cross-coupled transistor pair to a differential output port of the differential transistor pair. At optional step 506, resistance in an active inductive load coupled to the differential output can be adjusted. At step 508, a differential output signal is received from the differential output port.

Figure 6:
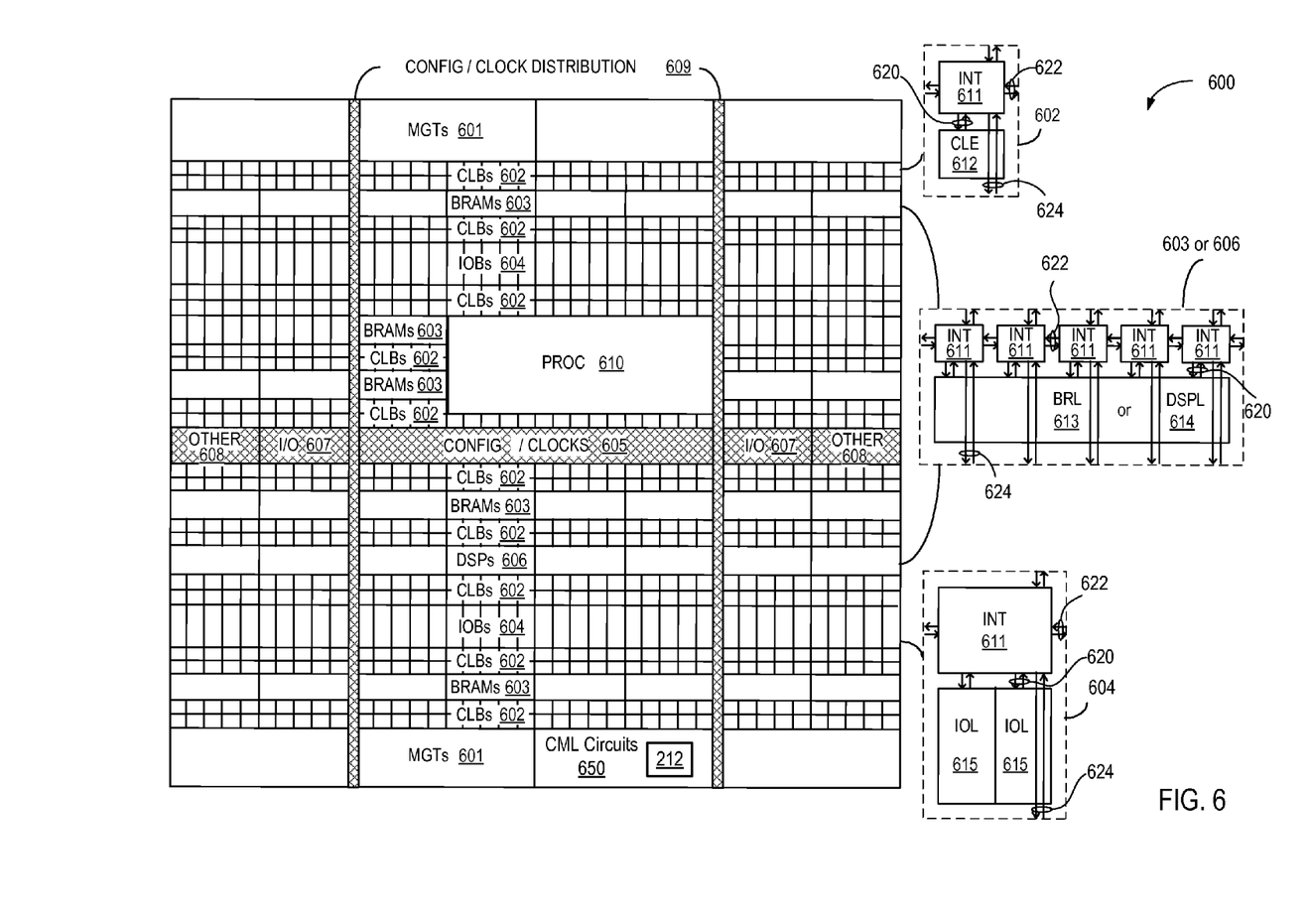
FIG. 6 illustrates an example architecture of an FPGA having a cross-coupled active inductive load circuits(s).

The cross-coupled active inductive load 212 can be used in various CML logic applications, including on various integrated circuit applications. For example, the cross-coupled active inductive load 212 can be used on a programmable integrated circuit, such as a field programmable gate array (FPGA). FIG. 6 illustrates an example architecture of an FPGA 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The FPGA 600 can include CML circuits 650. The CML circuits 650 can include one or more differential outputs coupled to a respective one or more cross-coupled active inductive loads 212.

While the foregoing is directed to specific examples, other and further examples may be devised without departing from the basic scope thereof, and the scope thereof is determined by the claims that follow.

What is claimed is:

1. A current-mode logic (CML) circuit, comprising:
a differential transistor pair having a differential input port configured to receive a differential input voltage, a bias port configured for coupling to a current source, and a differential output port distinct from the differential input port; and
a load circuit coupled to the differential output port, the load circuit comprising:
an active inductive load;
a cross-coupled transistor pair having sources directly coupled to a supply voltage; and
a switch comprising a first pair of transistors coupled between drains of the cross-coupled transistor pair and drains of the differential transistor pair, a transistor width of the first pair of transistors of the switch being smaller than a transistor width of the cross-coupled transistor pair.

2. The CML circuit of claim 1, wherein the active inductive load comprises a first active inductor coupled to a first transistor in the differential transistor pair and a second active inductor coupled to a second transistor in the differential transistor pair, each of the first active inductor and the second active inductor comprising a transistor and a resistance coupled between a gate and a drain of the transistor.

3. The CML circuit of claim 2, wherein the resistance in each of the first active inductor and the second active inductor comprises a programmable resistor.

4. The CML circuit of claim 2, wherein, for each of the first active inductor and the second active inductor, the transistor comprises a p-channel transistor having a source coupled to the supply voltage, the drain of the transistor being coupled to a respective output port of the differential output port.

5. The CML circuit of claim 2, wherein the first pair of transistors is a first pair of p-channel transistors having respective drains coupled to the differential output port and respective gates coupled to receive a control signal.

6. The CML circuit of claim 5, wherein the cross-coupled transistor pair comprises a second pair of p-channel transistors having respective sources directly coupled to the supply voltage and respective drains coupled to respective sources of the first transistor pair of the switch.

7. The CML circuit of claim 1, wherein the differential transistor pair comprises a pair of n-channel transistors having respective drains coupled to the differential output port, respective gates coupled to the differential input port, and respective sources coupled to the bias port.

8. The CML circuit of claim 7, further comprising the current source coupled to the bias port.

9. A current-mode logic (CML) circuit, comprising:
a plurality of CML cells coupled to perform a logic operation, each of the CML cells comprising:
a differential transistor pair having a differential input port configured to receive a differential input voltage, a bias port configured for coupling to a current source, and a differential output port distinct from the differential input port; and a load circuit coupled to the differential output port, the load circuit comprising:

an active inductive load;

a cross-coupled transistor pair having sources directly coupled to a supply voltage; and a switch comprising a first pair of transistors coupled between drains of the cross-coupled transistor pair and drains of the differential transistor pair, a transistor width of the first pair of transistors of the switch being smaller than a transistor width of the cross-coupled transistor pair.

10. The CML circuit of claim 9, wherein the active inductive load comprises a first active inductor coupled to a first transistor in the differential transistor pair and a second active inductor coupled to a second transistor in the differential transistor pair, each of the first active inductor and the second active inductor comprising a transistor and a resistance coupled between a gate and a drain of the transistor.

11. The CML circuit of claim 10, wherein the first pair of transistors is a first pair of p-channel transistors having respective drains coupled to the differential output port and respective gates coupled to receive a control signal.

12. The CML circuit of claim 11, wherein the cross-coupled transistor pair comprises a second pair of p-channel transistors having respective sources directly coupled to the supply voltage and respective drains coupled to respective sources of the first transistor pair of the switch.

13. The CML circuit of claim 9, wherein the differential transistor pair comprises a pair of n-channel transistors having respective drains coupled to the differential output port, respective gates coupled to the differential input port, and respective sources coupled to the bias port.

14. A method of operating a current-mode logic (CML) circuit having a differential transistor pair coupled to a load circuit configured for inductive broadbanding, the method comprising:

coupling a differential input signal to a differential input port of a differential transistor pair, the differential transistor pair having a differential output port distinct from the differential input port;

controlling a switch comprising a first pair of transistors to couple a cross-coupled transistor pair of the load circuit to the differential output port of the differential transistor pair, sources of the cross-coupled transistor pair being directly coupled to a supply voltage, a transistor width of the first pair of transistors of the switch being smaller than a transistor width of the cross-coupled transistor pair; and receiving a differential output signal from the differential output port of the differential transistor pair.

15. The method of claim 14, further comprising:

controlling a resistance in an active inductive load of the load circuit.

16. The method of claim 15, wherein the active inductive load comprises a first active inductor coupled to a first transistor in the differential transistor pair and a second active inductor coupled to a second transistor in the differential transistor pair, each of the first active inductor and the second active inductor comprising a transistor and a programmable resistor coupled between a gate and a drain of the transistor.

17. The method of claim 16, wherein the first pair of transistors is a first pair of p-channel transistors having respective drains coupled to the differential output port and respective gates coupled to receive a control signal.

18. The method of claim 17, wherein the cross-coupled transistor pair comprises a second pair of p-channel transistors having respective sources directly coupled to the supply voltage and respective drains coupled to respective sources of the first transistor pair of the switch.

* * * * *